United States Patent [19]

McClure

[11] Patent Number: 5,379,260
[45] Date of Patent: Jan. 3, 1995

[54] MEMORY CELL HAVING A SUPER SUPPLY VOLTAGE

[75] Inventor: David C. McClure, Carrollton, Tex.

[73] Assignee: SGS-Thomson Microelectronics, Inc., Carrollton, Tex.

[21] Appl. No.: 128,895

[22] Filed: Sep. 30, 1993

[51] Int. Cl.⁶ .................................................. G11C 29/00
[52] U.S. Cl. .................................. 365/201; 365/154; 365/156; 365/226; 371/21.1; 371/21.4
[58] Field of Search .............. 365/201, 226, 154, 156; 371/21.1, 21.4

[56] References Cited

U.S. PATENT DOCUMENTS

| | | | |
|---|---|---|---|
| 4,504,929 | 3/1985 | Takemae | 365/201 X |
| 4,858,182 | 8/1989 | Pang | 265/226 |
| 5,005,068 | 4/1991 | Ikeda | 365/154 |
| 5,079,744 | 1/1992 | Tobita | 365/201 |
| 5,132,929 | 7/1992 | Ochii | 365/201 |
| 5,159,571 | 10/1992 | Ito | 365/201 |

Primary Examiner—Eugene R. LaRoche
Assistant Examiner—Son Mai
Attorney, Agent, or Firm—Renee M. Larson; Lisa K. Jorgenson; Richard K. Robinson

[57] ABSTRACT

According to the present invention, a static random access memory (SRAM) cell which is normally supplied with a nominal supply voltage under normal operating conditions, may be supplied with a super supply voltage so that tests requiring high voltages and increased current levels, such as diagnostic and reliability "stress" tests may be performed. The super supply voltage is greater in magnitude than the nominal supply voltage, and may range from approximately 7 volts to 13 volts for SRAM cells requiring a positive voltage supply. The super supply voltage level may be controlled by a test mode or by a bond pad using existing power supply circuitry.

31 Claims, 1 Drawing Sheet

MEMORY CELL HAVING A SUPER SUPPLY VOLTAGE

BACKGROUND OF THE INVENTION

1. Field of the Invention

The present invention relates generally to integrated circuit devices, and more specifically to a static random access memory (SRAM) array having a super supply voltage.

2. Description of the Prior Art

The design and manufacture of SRAM devices which are free of design and reliability problems is a challenging task. It is not uncommon for SRAM arrays to be fraught with hard failures and reliability problems, especially when first silicon of a new SRAM device is tested. Therefore, it is standard practice to test SRAM devices for "hard" functional failures, as well as propensities to reliability problems. Such device testing is critical for identifying, analyzing, and correcting problem areas early.

Traditional testing methods typically use a nominal memory array supply voltage, such as VCC at 5 volts, to perform diagnostic and reliability testing. While testing at 5 volts often identifies functional failures, this voltage level makes it difficult to accelerate and thus identify failures that are caused by latent defects. Often such defects are not identified and corrected until much time has been expended in performing reliability tests such as the Infant Life test which can take hundreds of hours. Additionally, using traditional testing methods, it is difficult to identify latent failures, which may not show until later, resulting in high failure-in-time (FIT) rates.

SUMMARY OF THE INVENTION

It is therefore an object of the present invention to provide a super supply voltage to cells of a memory array in order to determine if failing cells can be made to pass;

It is therefore further an object of the present invention to provide a super supply voltage to cells of a memory array in order to accelerate the failure of weak cells;

It is therefore further an object of the present invention to provide a super supply voltage to cells of a memory array to provide more complete identification of known and potential cell reliability problems; and It is therefore further an object of the present invention to provide a super supply voltage to cells of a memory array while utilizing existing supply voltage circuitry.

Therefore, according to the present invention, a static random access memory (SRAM) cell which is normally supplied with a nominal supply voltage under normal operating conditions, may be supplied with a super supply voltage so that tests requiring high voltages and increased current levels, such as diagnostic and reliability "stress" tests may be performed. The super supply voltage is greater in magnitude than the nominal supply voltage, and may range from approximately 7 volts to 13 volts for SRAM cells requiring a positive voltage supply. The super supply voltage level may be controlled by a test mode or by a bond pad using existing power supply circuitry.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

During the design and manufacture of static random access memory (SRAM) devices, it is important to identify and, if possible, to repair device failures and address latent weaknesses. Therefore, diagnostic and reliability tests perform an important function for a variety of SRAM arrays, including those memory arrays having Poly-R Load, 6 Transistor, and thin film transistor (TFT) memory cells. Traditional device testing is performed at a nominal supply voltage capable of identifying and repairing device failures and weaknesses with only limited success. The present invention is directed to performing diagnostic and reliability tests at elevated voltages in the memory array, thus accomplishing repair of failed devices and identification of latent defects more effectively.

Figure 1:
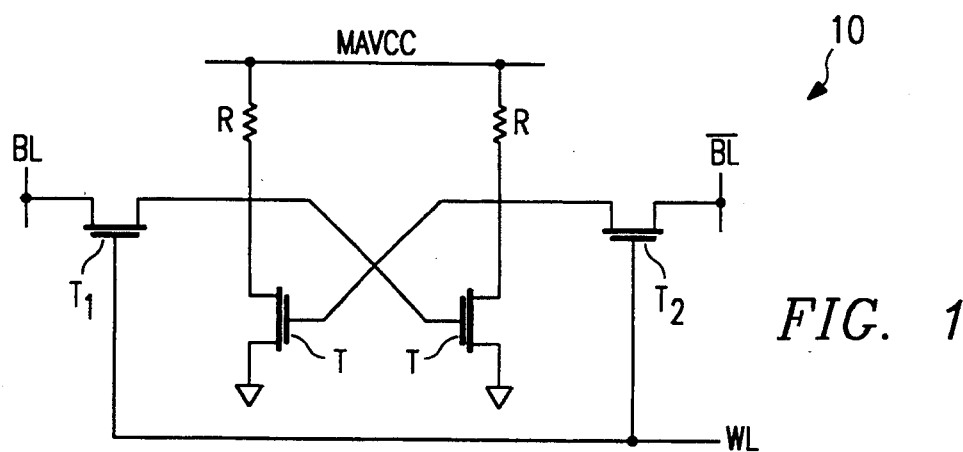
FIG. 1 is a schematic diagram of a Poly-R Load memory cell according to the present invention.

Referring to FIG. 1, a schematic diagram of a Poly-R Load memory cell 10, according to the present invention, is shown. The wordline WL of memory cell 10 is connected to n-channel transistors T1 and T2 which in turn are connected to bitline BL and bitline complement $\overline{BL}$, respectively, as shown. N-channel transistors T are connected to n-channel transistors T1 and T2 as shown and pulled up to the memory array supply voltage, MAVCC, through polycrystalline silicon resistors R.

During normal operation, memory array supply voltage MAVCC is equal to a nominal voltage level. This nominal voltage level is equal to the voltage level supplied to the SRAM interface, control, and periphery circuitry outside of the memory array by a second voltage supply source, such that the voltage level throughout the entire SRAM is uniform. This nominal voltage may be VCC and typically ranges from 5 volts to 7 volts. But during device testing, MAVCC may be selectively set to a super voltage level typically in the range of 7 up to 13 volts, the transistor junction breakdown voltage. Resistors R are pull-up load elements, providing resistive value, such that when the voltage level of MAVCC is increased from a VCC level to a super voltage level, a higher current flows through resistors R and a higher voltage level is established within the cell.

Figure 2:
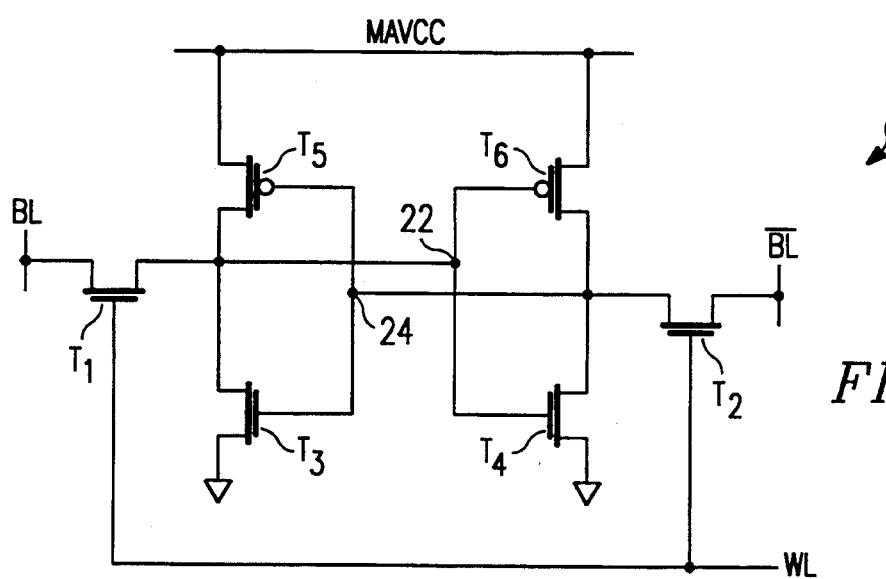
FIG. 2 is a schematic diagram of a 6 Transistor memory cell according to the present invention.

FIG. 2 shows a schematic diagram of a 6 Transistor memory cell 20, according to the present invention. The wordline WL of memory cell 20 is connected to the gates of transistors T1 and T2, whose source/drain are connected to bitline BL and bitline complement $\overline{BL}$, respectively, as shown. Transistor T1 is connected to node 22 which connects transistors T4 and T6 as shown. Similarly, T2 is connected to node 24 which connects transistors T3 and T5 as shown. P-channel transistors T5 and T6 are pull-up load elements, similar in function to resistors R of FIG. 1, and provide resistive value, such that when the voltage level of MAVCC is increased from a VCC level to a super voltage level, a higher current flows through p-channel transistors T5 and T6. P-channel transistors T5 and T6 may also be thin film transistors (TFTs).

The present invention is also applicable to memory arrays which use alternate voltage supplies, such as negative voltage supplies. For instance, if negative voltage supplies were used, the resistive load elements discussed in FIGS. 1 and 2 would be pull-down resistive load elements. In any case, the magnitude of the super voltage level will be greater than the magnitude of the nominal voltage level for memory arrays having either positive or negative voltage supply systems.

Selectively setting the memory array supply voltage MAVCC to elevated levels provides advantages for diagnostic and reliability or "stress" testing. During a diagnostic test, such as failure analysis, MAVCC may be set to a moderate super voltage level to determine if a faulty memory cell, which failed the diagnostic test at a nominal supply voltage, will pass when it is supplied with more current through its resistive load elements by virtue of a higher supply voltage. For example, a faulty Poly R Load memory cell having leakage current problems at 5 volts might pass when MAVCC is selectively set to 8 volts and the memory cell is supplied higher resistive current through resistors R. The increased current supplied to the memory cell through resistors R may be sufficient to overcome the leakage current problems, allowing the previously failed memory cell to pass.

Also, setting MAVCC to a high super voltage level subjects the memory cell to a stress test where more current is provided through the resistive load elements of the memory cell in order to accelerate reliability failures. Even if the increased current through the resistive load elements is not sufficient to induce hard failures, it may be enough to weaken the memory cell, causing it to fail traditional reliability screen tests such as data retention and low voltage read disturb, etc. As an example, increasing MAVCC to a super voltage level such as 13 volts maximally stresses the memory cell such that failures of the type typically seen in multiple hour Infant Life or burn-in tests may be realized much sooner.

A super supply voltage level can be supplied to the memory array supply voltage MAVCC in two ways: entering a test mode which increases MAVCC to a super voltage level or directly manipulating MAVCC to a super voltage level through an external bond pad.

The memory array supply voltage MAVCC can be tied common throughout all cells of the memory array and brought out to a separate bond pad that can be forced separately by the tester, but would ultimately be bonded to VCC when the device is packaged. If MAVCC is brought out to a separate bond pad, it would be easier to set MAVCC to a super voltage level in order to perform tests. As a practical matter, probably every cell in the memory array would then have the capability to be brought to a super voltage level, such that the use of an external bond pad would allow all cells in a memory array to be brought to a super voltage level at the same time.

If the memory array supply voltage MAVCC for an entire memory array were tied to an external bond pad, it would not be necessary to use any transistors to control the super voltage signal. Therefore, transistor characteristics such as transistor punch through, BVDSS, and snap back voltage, BVDII, would not limit the super voltage level which may be achieved, allowing for super voltage levels of up to 13 volts, at which point junction breakdown occurs, thereby greatly increasing the "stress value" of the test. Also, tying MAVCC to an external bond pad means that it is not necessary to enter a test mode in order to obtain a super voltage level. The desired super voltage may be achieved at any time by simply setting the MAVCC bond pad to the desired voltage level.

The present invention allows for a super voltage level of 13 volts, which is a substantially higher voltage level than is currently used to test SRAMs. Even though the memory cell has transistors, it is possible to achieve this super voltage level without concern for transistor punch through, BVDSS, and snap back voltage, BVDII, because of how the memory cell operates. When the memory cell is supplied with a super voltage level, one side of the cell is equal to a high voltage level while the other side is equal to a low voltage level. Referring to FIG. 1, for instance, this means that wordline WL is equal to a low voltage level, transistors T1 and T2 are off, one of the pull-down n-channel transistors T is off while the other n-channel transistor T is on, but operates in the linear region, not the saturation region, of the transistor. Since none of the memory cell transistors are operating in saturation, the super voltage level supplied by MAVCC is not limited by either BVDII or BVDSS.

If, however, the MAVCC signal is not brought out to an external bond pad and is therefore controlled through transistors, the super voltage level that may be obtained is limited by the device physics of the transistors. Two transistor characteristics of special interest are BVDSS and BVDII. Transistor punch through, BVDSS, is caused by the shorting of the source and drain depletion regions of a transistor and occurs at approximately 9 volts. At approximately 7 volts, snap back voltage, or BVDII, can occur due to parasitic bipolar effects. So, if transistors are used to control the MAVCC voltage level, MAVCC super voltage may be limited to 7 volts to 9 volts. While MAVCC may thus be limited, an advantage of controlling the memory array supply voltage MAVCC through transistors is that a test mode may be easily controlled at the SRAM package level. For instance, appropriately setting the voltage level of a package pin to a particular voltage level can force the device into a test mode with a super supply voltage level.

Selectively setting the memory array supply voltage, MAVCC, to a super voltage level provides important test advantages for SRAM memory arrays. Super voltage levels may be used to determine if failing cells can be made to pass based on a higher current through the resistive load elements without affecting the voltage supplied to the rest of the die. Additionally, super voltage levels can also be used to stress memory devices by supplying the super voltage level to memory cell nodes, thereby providing more current and voltage through resistive load elements in order to induce failures. Even if the increased current is not sufficient to cause a hard failure, it may "weaken" the cell enough to cause failure of other reliability screen tests such as data retention and low voltage read disturb. Selectively setting the memory array supply voltage, MAVCC, is done independently of the wordline voltage level which establishes the initial high voltage level of the memory cell.

An elevated memory array supply voltage level addresses a number of problems associated with traditional SRAM testing methods. A moderate super supply voltage level, such as 8 volts, may be utilized as a diagnostic tool to determine if failing cells can be forced to pass. This is especially useful where the failures are caused by leakage current and forcing a higher current through the resistive load elements of the cell will allow the cell to pass. Additionally, a high super supply voltage level, such as 13 volts, may be used to accelerate failures of "weak" cells having latent defects by supplying more voltage and current through the resistive load elements of these cells. Such "stress" testing provides an important reliability test tool, making it possible to obtain a more complete identification of existing and future reliability problems and thus improve device quality by lowering the failure-in-time (FIT) rate. Additionally, identification of cells having latent defects allows these cells to be repaired or discarded. Finally, a super supply voltage may be introduced to a memory cell through MAVCC using existing circuitry.

While the invention has been particularly shown and described with reference to a preferred embodiment, it will be understood by those skilled in the art that various changes in form and detail may be made therein without departing from the spirit and scope of the invention.

What is claimed is:

1. A static random access memory (SRAM), comprising:
   a plurality of memory cells, with each memory cell having a plurality of resistive load elements;
   control, interface, and periphery circuitry that provides control signals to the memory cells;
   a first power supply that supplies a nominal voltage level to the control, interface, and periphery circuitry; and
   a second power supply that is connected to the resistive load elements of each memory cell and is controlled to selectively be set to the nominal voltage level for normal operating conditions or to a super voltage level suitable for testing the memory cells, wherein the magnitude of the super voltage level is greater than the magnitude of the nominal voltage level.

2. The memory array of claim 1, wherein the nominal voltage level is equal to VCC.

3. The memory array of claim 2, wherein the resistive load elements are pull-up resistive load elements.

4. The memory array of claim 3, wherein each memory cell is a Poly R Load memory cell and the pull-up resistive load elements are pull-up polycrystalline silicon resistors.

5. The memory array of claim 3, wherein each memory cell is a 6 Transistor memory cell and the pull-up resistive load elements are pull-up p-channel transistors.

6. The memory array of claim 3, wherein the pull-up resistive load elements are pull-up p-channel thin film transistors.

7. The memory array of claim 1, wherein the second power supply may be controlled to be set to the super voltage level in the range of approximately 7 volts to 13 volts.

8. The memory array of claim 7, wherein the second power supply is set to the super voltage level of approximately 8 volts and the memory cells are tested with diagnostic tests.

9. The memory array of claim 7, wherein the second power supply is set to the super voltage level of approximately 8 volts to 13 volts and the memory cells are tested with reliability tests.

10. The memory array of claim 1, wherein the second power supply is controlled by a test mode.

11. The memory array of claim 1, wherein the second power supply is controlled by a bond pad.

12. The memory array of claim 1, wherein each memory cell is a Poly R Load cell and the resistive load elements are polycrystalline silicon resistors.

13. The memory array of claim 1, wherein each memory cell is a 6 transistor cell and the resistive load elements are p-channel transistors.

14. The memory array of claim 1, wherein the resistive load elements are p-channel thin film transistors.

15. A static random access memory (SRAM), comprising:
    a plurality of memory cells, with each memory cell having a plurality of pull-up resistive load elements;
    control, interface, and periphery circuitry that provides control signals to the memory cells;
    a first power supply that supplies a nominal voltage level to the control, interface, and periphery circuitry; and
    a second power supply that is connected to the pull-up resistive load elements of each memory cell and is controlled to selectively be set to the nominal voltage level, in the range of 5 volts to 7 volts, for normal operating conditions or to a super voltage level, in the range of 7 volts to 13 volts, suitable for testing the memory cells.

16. The memory array of claim 15, wherein each memory cell is a Poly R Load memory cell and the pull-up resistive load elements are pull-up polycrystalline silicon resistors.

17. The memory array of claim 15, wherein each memory cell is a 6 Transistor memory cell and the pull-up resistive load elements are pull-up p-channel transistors.

18. The memory array of claim 15, wherein each memory cell is a thin film transistor memory cell and the pull-up resistive load elements are pull-up p-channel transistors.

19. The memory array of claim 15, wherein the second power supply is controlled by a test mode.

20. The memory array of claim 15, wherein the second power supply is controlled by a bond pad.

21. The memory array of claim 15, wherein the second power supply is set to the super voltage level and the memory cells are tested with diagnostic tests.

22. The memory array of claim 15, wherein the second power supply is set to the super voltage level and the memory cells are tested with reliability tests.

23. A method for controlling the power supply voltage of a static random access memory (SRAM) array of a SRAM, comprising the steps of:
    determining whether the memory array should be in a normal operating mode or a test mode; and
    selectively setting the power supply voltage of the memory array to a nominal voltage level equal to the voltage level supplied to the control, interface, and periphery circuitry of the SRAM if it is determined that the memory array should be in the normal operating mode, and selectively setting the power supply voltage of the memory array to a super voltage level if it is determined that the memory array should be in the test mode; wherein the magnitude of the super voltage level is greater than the magnitude of the nominal voltage level.

24. The method of claim 23, wherein the memory array has a plurality of memory cells, with each memory cell having a plurality of resistive load elements.

25. The method of claim 24, wherein the nominal voltage level is equal to VCC.

26. The method of claim 25, wherein each memory cell is a Poly R Load memory cell and the resistive load elements are pull-up polycrystalline silicon resistors.

27. The method of claim 25, wherein each memory cell is a 6 Transistor memory cell and the resistive load elements are pull-up p-channel transistors.

28. The method of claim 25, wherein the resistive load elements are pull-up p-channel thin film transistors.

29. A method for controlling the power supply voltage of a static random access memory (SRAM) array of a SRAM, comprising the steps of:

determining whether the memory array, which has a plurality of memory cells with each memory cell having a plurality of resistive load elements, should be in a normal operating mode or a test mode; and selectively setting the power supply voltage of the memory array to a nominal voltage level equal to the voltage level supplied to the control, interface, and periphery circuitry of the SRAM if it is determined that the memory array should be in the normal operating mode, and selectively setting the power supply voltage of the memory array to a super voltage level, in the range of approximately 7 volts to 13 volts, if it is determined that the memory array should be in the test mode.

30. The method of claim 23, wherein the power supply voltage is selectively set by a test mode.

31. The method of claim 23, wherein the power supply voltage is selectively set by a bond pad.

* * * * *